United States Patent
Aljohani et al.

(10) Patent No.: US 11,051,153 B1
(45) Date of Patent: *Jun. 29, 2021

(54) METHOD FOR COMPRESSIVE SENSING BASED LPWAN COMMUNICATION

(71) Applicant: King Abdulaziz University, Jeddah (SA)

(72) Inventors: Abdulah Aljohani, Jeddah (SA); Waleed Alasmary, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

This patent is subject to a terminal disclaimer.

(21) Appl. No.: 17/062,186

(22) Filed: Oct. 2, 2020

Related U.S. Application Data

(63) Continuation of application No. 16/944,991, filed on Jul. 31, 2020.

(51) Int. Cl.
  *H04W 4/70* (2018.01)
  *H04W 80/02* (2009.01)
  (Continued)

(52) U.S. Cl.
  CPC ......... *H04W 4/70* (2018.02); *H03M 13/1575* (2013.01); *H03M 13/19* (2013.01);
  (Continued)

(58) Field of Classification Search
  CPC ....... H04W 4/40; H04W 84/18; H04W 4/029; H04Q 9/00
  See application file for complete search history.

(56) References Cited

U.S. PATENT DOCUMENTS

2010/0146357 A1* 6/2010 Larsson ................ H04L 5/0044
  714/750
2010/0265799 A1* 10/2010 Cevher ................... G01S 3/801
  367/121
(Continued)

FOREIGN PATENT DOCUMENTS

| CN | 102939733 B | 8/2016 |
| CN | 110062348 A | 7/2019 |
| WO | 2017/114578 A1 | 7/2017 |

OTHER PUBLICATIONS

Alasmary, et al. ; Velocity Awareness in Vehicular Networks via Sparse Recovery; IEEE Transactions on Vehicular Technology, vol. 66, No. 10, Oct. 2017: 15 Pages.
(Continued)

*Primary Examiner* — Raj Jain
(74) *Attorney, Agent, or Firm* — Oblon, McClelland, Maier & Neustadt, L.L.P.

(57) ABSTRACT

A LoRa device for communicating sensor signals in a low power wide area network (LPWAN) includes a physical layer using Hamming encoding and Gray indexing with chirp spread signal (CSS) modulation to encode and modulate the sensor signals and a medium access layer (MAC) including a compressive sensing sub-layer which reduces encoded, modulated signals to sparse vectors. A transmission packet is formed by combining the sparse vectors with a selected set of sparse vectors representing past measurements and the incoming velocity of the sensor signals. A receiver decompresses the transmission packet by reconstructing, at a sparse recovery sub-layer of a receiver MAC layer, the encoded, modulated sensor signals. A decoder path removes the CSS modulation and Gray indexing, and Hamming decodes the sensors signals.

7 Claims, 14 Drawing Sheets

(51) Int. Cl.
  *H04W 4/40*    (2018.01)
  *H04W 84/18*   (2009.01)
  *H03M 13/15*   (2006.01)
  *H03M 13/19*   (2006.01)
  *H04L 1/00*    (2006.01)
  *H04B 1/69*    (2011.01)

(52) U.S. Cl.
  CPC ............. *H04B 1/69* (2013.01); *H04L 1/0061* (2013.01); *H04W 4/40* (2018.02); *H04W 80/02* (2013.01); *H04W 84/18* (2013.01); *H04B 2001/6912* (2013.01)

(56) References Cited

U.S. PATENT DOCUMENTS

| | | | | |
|---|---|---|---|---|
| 2018/0338017 A1* | 11/2018 | Mekuria | ................. | H04L 69/04 |
| 2020/0059865 A1* | 2/2020 | Gilson | ................... | H04W 4/38 |
| 2020/0128383 A1* | 4/2020 | Maier | ..................... | H04W 4/38 |
| 2020/0244501 A1* | 7/2020 | Shattil | ............... | H04L 25/03834 |
| 2020/0322703 A1* | 10/2020 | Bures | ..................... | G06N 20/00 |

OTHER PUBLICATIONS

LoRa—LoRa documenation ; https://lora.readthedocs.io.en/latest/ ; Jun. 25, 2020 ; 14 Pages.

\* cited by examiner

METHOD FOR COMPRESSIVE SENSING BASED LPWAN COMMUNICATION

CROSS-REFERENCE TO RELATED APPLICATIONS

The present application is a Continuation of Ser. No. 16/944,991, pending, having a filing date of Jul. 31, 2020.

BACKGROUND

Technical Field

The present disclosure is directed to a system, method and apparatus for compressive sensing-aided LPWAN MAC layer for LoRa communication devices for communication with a sparse recovery receiver.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Research in low power wide area networks (LPWAN) in the field of Internet of Things (IoT) communications is intended to address the short range and high-power consumption of conventional IoT technologies. LPWAN technologies have exposed the need for reliable knowledge about the performance of such networks in the IoT market. Projections have been made that more than seven billion of a projected thirty billion IoT devices will be LPWAN-based, as shown in FIG. 1. (See E. Berthelsen and J. Morrish, "Forecasting the internet of things revenue opportunity." ttps://www.machinaresearch.com, 2015. [Online; accessed 30 Nov. 2019]; and Nokia White Paper, "LTE evolution for IoT connectivity." world wide web.resources.alcatel-ucent-.com/asset/200178, 2016. [Online; accessed 30 Nov. 2017], each incorporated herein by reference in their entirety).

LoRa, (Long Range) is an LPWAN protocol based on spread spectrum modulation techniques derived from chirp spread spectrum (CSS) technology. A LoRaWAN-based network is made up of end devices, gateways, a network server, and application servers. End devices send data to gateways (uplinks), and the gateways pass it on to the network server, which, in turn, passes it on to the application server as necessary. End devices in a LoRaWAN network come in three classes: Class A, Class B and Class C. While end devices can always send uplinks at will, the device's class determines when it can receive downlinks. The class also determines a device's energy efficiency. The more energy efficient a device, the longer the battery life.

All end devices must support Class A ("Aloha") communications. Class A end devices spend most of their time in sleep mode. Because LoRaWAN is not a "slotted" protocol, end devices can communicate with the network server any time there is a change in a sensor reading or when a timer fires. Basically, they can wake up and talk to the server at any moment. After the device sends an uplink, it "listens" for a message from the network one and waits two seconds after the uplink (receive windows) before going back to sleep. Class A is the most energy efficient and results in the longest battery life.

While LoRa is capable of transmission ranges up to 20 km, the achievable rate, as well as well as the data exchange timeframe, are very limited. Additionally, with an increase in the number of sources, and the use of a LoRa-Class A pure Aloha Multiple Access (MAC) scheme, network congestion is inevitable. Therefore, it is desirable to reduce the number of times each source contends for multiple access without loss of data.

An improvement to the original ALOHA protocol was "Slotted ALOHA", which introduced discrete timeslots and increased the maximum throughput. A station can start a transmission only at the beginning of a timeslot, and thus collisions are reduced. In this case, only transmission-attempts within 1 frame-time and not 2 consecutive frame-times need to be considered, since collisions can only occur during each timeslot. Thus, the probability of there being zero transmission-attempts by other stations in a single timeslot is $\text{Prob}_{slotted} = e^{-G}$, the probability of a transmission requiring exactly k attempts is (k−1 collisions and 1 success): $\text{Prob}_{slotted} k = e^{-G}(1-e^{-G})^{k-1}$ and the throughput is: $S_{slotted} = Ge^{-G}$, where G denotes transmission attempts per frame time. The maximum throughput is 1/e frames per frame-time (reached when G=1), which is approximately 0.368 frames per frame-time, or 36.8%.

Slotted ALOHA is used in low-data-rate tactical satellite communication networks by military forces, in subscriber-based satellite communications networks, mobile telephony call setup, set-top box communications and in the contact-less RFID technologies.

The Low Power Wide Area Network (LPWAN) has emerged as a new IoT communication paradigm. (See U. Raza, P. Kulkarni, and M. Sooriyabandara, "Low power wide area networks: An overview," IEEE Communications Surveys & Tutorials Vol. 19, No. 2, pp. 855-873, 2017, incorporated herein by reference in its entirety). LPWAN has been proposed to tackle the issues of short range and high-power consumption of the conventional IoT technologies. LPWAN aims to complement the current IoT market by offering a unique aspect of wide-area connectivity while keeping end-device battery consumption minimal. In contrast to conventional short-range non-cellular IoT technologies, such as Zig-Bee, Bluetooth, and Wi-Fi, a single LPWAN gateway can cover up to 20 km in range.

Although cellular networks can provide wide-range coverage, their end-devices cannot achieve the five to ten years battery lifespan that LPWAN counterparts can offer. (See Raza et al.; and H. Wang and A. O. Fapojuwo, "A survey of enabling technologies of low power and long range machine-to-machine communications," IEEE Communications Surveys & Tutorials, vol. 19, no. 4, pp. 2621-2639, 2017, each incorporated herein by reference in their entirety).

However, wide-range connectivity and low-power consumption performance come at the expense of low data rate, low reliability, and high latency. (See Raza et al.; and W. Yang, M. Wang, J. Zhang, J. Zou, M. Hua, T. Xia, and X. You, "Narrowband wireless access for low-power massive internet of things: A bandwidth perspective," IEEE Wireless Communications, vol. 24, no. 3, pp. 138-145, 2017, each incorporated herein by reference in their entirety). From this perspective, IoT networks can be categorized into two machine-type communication (MTC) schemes, namely, massive non-critical MTC and critical MTC. LPWAN fulfills the massive non-critical MTC communication in which the data rate, reliability, and latency are relaxed. The critical-based MTC, such as vehicle-to-vehicle (V2V) communication and traffic safety applications, are out of the scope of current LPWAN technologies since extreme low-latency, and high-reliability are stringent requirements. (See E. Berthelsen and J. Morrish, "Forecasting the internet of things revenue opportunity." world wide web.machinaresearch.com, 2015. [Online; accessed 30 Apr. 2019]; and Nokia White Paper, "LTE evolution for IoT connectivity." world wide web.resources.alcatel-ucent.com/asset/200178, 2016. [Online; accessed 30 Apr. 2019], each incorporated herein by reference in their entirety).

Research in LPWAN technologies can be divided into two main categories. The first category is technologies that are based on unlicensed spectrums, such as SIGFOX, LoRa and Ingenu. (See J. C. Zuniga and B. Ponsard, "Sigfox system description," LPWAN@ IETF97, Nov. 14, 2016; LoRa-Alliance, "A technical overview of LoRaWAN," Technical Marketing Workgroup, November 2015; and Ingenu, "How RPMA works?" White Paper, 2016, each incorporated herein by reference in their entirety). The second category includes technologies that are using the licensed spectrum and utilizing the cellular infrastructure, namely, Narrow-Band IoT (NB-IoT), LTE-M and EC-GSM. (See Wang et al.; P. Thubert, A. Pelov, and S. Krishnan, "Low-power wide-area networks at the ietf," IEEE Communications Standards Magazine, vol. 1, pp. 76-79, March 2017; D. Flore, "3GPP standards for the Internet-of-Things," Recuperado el, vol. 25, 2016; and J. Lee, Y. Kim, Y. Kwak, J. Zhang, A. Papasakellariou, T. Novlan, C. Sun, and Y. Li, "LTE-advanced in 3GPP rel-13/14: An evolution toward 5G," IEEE Communications Magazine, vol. 54, no. 3, pp. 36-42, each incorporated herein by reference in their entirety). Some conventional LPWAN technologies are compared in Table I.

Semtech's LoRa technology," July 2017, white paper; Semtech, "Revolutionising smart agriculture using semtech's LoRa technology," October 2017, white paper; Semtech, "Real-world LoRaWAN network capacity for electrical metering applications," September 2017, white paper; and D. Magrin, M. Centenaro, and L. Vangelista, "Performance evaluation of LoRa networks in a smart city scenario," in Proceedings of the International Conference On Communications, 2017, pp. 1-7, each incorporated herein by reference in their entirety).

LoRa is a physical layer that employs Chirp Spread Spectrum (CSS) modulation. (See LoRa-Alliance; and O. Bernard, A. Seller, and N. Sornin, "Low power long range transmitter," European Patent EP 2763321 A1, Aug. 6, 2014; O. Seller and N. Sornin, "Low power long range transmitter," Aug. 7, 2014, US20140219329; G. Ferre and A. Giremus, "LoRa physical layer principle and performance analysis," in 2018 25th IEEE International Conference on Electronics, Circuits and Systems (ICECS), December 2018, pp. 65-68 and A. Berni and W. Gregg, "On the utility of chirp modulation for digital signaling," IEEE Transactions on Communications, vol. 21, no. 6, pp. 748-751, June 1973, each incorporated herein by reference in their entirety). On top of the LoRa physical layer, long range wide area networks (LoRaWAN) define a simple medium access control (MAC) protocol in which LoRaWAN allows end devices, e.g., sensors, to communicate with a network via gateways. However, this communication is limited by a small duty-cycle (e.g., 1%).

LoRa enables end devices to save energy, and network lifetime is increased. LoRa operates in unlicensed ISM

TABLE 1

Comparison of LPWAN technologies

| | SIGFOX [6] | LoRa [7] | INGENU [8] | NB-IoT [2, 9] |
|---|---|---|---|---|
| Range (URBAN) | >5 km | >15 km | >10 km | >20 km |
| Operating Band | ISM Sub-GHz | ISM Sub-GHz | ISM 2.4-GHz | Licensed LTE band |
| Data rate Down Link (DL) | 100 bps (DL) | 0.5 kbps (DL) | 20 kbps (DL) | 170 kbps (DL) |
| Up Link(UL) | 600 bps (UL) | 50 kbps (UL) | 80 kbps (UL) | 250 kbps (UL) |
| Modulation | UNB-DBPSK | CSS | RPMA-DSSS | QPSK |
| Bandwidth | 125 KHz | 125 KHz, 250 KHZ, 500 KHz | 1 MHz | 180 kHz |
| Payload Length(Bytes) | 12 B UL, 8 B DL | up to 250 B | 10 KB | 1600 B |

LoRa is widely used for LPWAN applications because LoRa networking is an open-source technology that enables autonomous network set-up at low cost. (See M. C. Bor, U. Roedig, T. Voigt, and J. M. Alonso, "Do LoRa low-power wide-area networks scale?" in Proceedings of the International Conference on Modeling, Analysis and Simulation of Wireless and Mobile Systems, 2016, pp. 59-67, incorporated herein by reference in its entirety). LoRa networks have been widely deployed for many applications and research systems. The openness of LoRa makes it an excellent choice for diverse IoT deployments. (See L. Vangelista, A. Zanella, and M. Zorzi, "Long-range IoT technologies: The dawn of LoRa," in Proceedings of the Future Access Enablers of Ubiquitous and Intelligent Infrastructures, 2015, pp. 51-58, incorporated herein by reference in its entirety).

General IoT applications include smart buildings, smart cities, smart agriculture, smart meters, and water quality measurement. (See Vangelista et al.; Semtech, "Smart buildings transformed using Semtech's LoRa technology," April 2017, white paper; Semtech, "Smart cities transformed using (Industrial, Scientific and Medical) radio bands that are available worldwide. However, usage time of the channels must be limited to a few seconds per day per node, in a fair usage policy. (See Eric B., "LoRa Documentation" ©2018, Powered by Sphinx 1.8.5 & Alabaster 0.7.12, incorporated herein by reference in its entirety). Hence, the main issue in LoRa and LoRaWAN is their throughput limitation, as the indicative physical bitrate varies between 250 and 1000 bps.

Moreover, when two end-devices transmit simultaneously using the same parameters (such as channel and Spreading Factor (SF)) and are received by the gateway with a similar power, a collision occurs and none of the signals are decoded by LoRa. Thus, both end-devices must retransmit, which further reduces their achievable throughput. If one signal has larger received power than the other signals, the capture effect allows this signal to be correctly decoded. Compressive sensing theory allows sparse sources to be sampled below the Nyquist rate and guarantees excellent recovery of the original source signal/data with certain conditions. (See Emmanuel Candès and Michael Wakin, An introduction to compressive sampling. *IEEE Signal Processing Magazine*, 25(2), pp. 21-30, March 2008, incorporated herein by reference in its entirety).

LoRa can be widely used for tracking and location exchange. The nature of kinematic information is known to be sparse, therefore compressive sampling can be used to optimize the transmission of the data at the LoRa devices, and for the recovery of the data at the gateway. Additionally, encoding in compressive sampling is a direct random linear combination which has very low complexity and can be easily implemented on the LoRa devices. Although the recovery at the gateway will require added complexity, a gateway is a powerful fusion center which can collect and analyze the data from multiple LoRa devices.

Accordingly, it is one object of the present disclosure to provide a system for a compressive sensing-based integrated with LoRa communications for IoT devices.

SUMMARY

In an exemplary embodiment, a system for communicating in a low power wide area network (LPWAN) is described, comprising a long range (LoRa) sensing device having circuitry including at least one sensor configured to generate bit stream of sensor signals, a first physical layer (PHY), a first medium access (MAC) layer, a compressive sensing-aided transmission sub-layer embedded within the first medium access layer, a first computer processing unit including a computer-readable medium comprising program instructions, executable by a first processing circuitry, to cause the first processing circuitry to receive, at the first physical layer of a LoRa device, the bit stream of sensor signals at an incoming velocity, encode the bit stream to generate an encoded bit stream, modulate the encoded bit stream by chirp spread spectrum modulation to generate a chirp modulated encoded bit stream, form a first transmission packet including at least a preamble, the chirp modulated encoded bit stream and a cyclic redundancy check (CRC), receive the first transmission packet by the first multiple access layer (MAC) of the LoRa device, compress the chirp modulated encoded bit stream of the first transmission packet into sparse vectors, combine the sparse vectors with a linear combination of a randomly selected set of sparse vectors representing past measurements and the in-coming velocity of the bit stream to generate a payload, form a second transmission packet including the preamble, the payload and the cyclic redundancy check, transmit, by the first physical layer, the second transmission packet at a randomly selected time, a receiver having circuitry including a second physical layer (PHY), a second medium access (MAC) layer, a sparse recovery sub-layer embedded within the second MAC layer, a second computer processing unit including a computer-readable medium comprising program instructions, executable by a second processing circuitry, to cause the second processing circuitry to receive, at the second physical layer, the second transmission packet, de-map the transmission packet to recover a compressed, encoded bit stream, reconstruct, by the sparse recovery sub-layer, the compressed, encoded bit stream by recovering sparse vectors to generate a chirp spread spectrum encoded bit stream, demodulate the chirp spread spectrum encoded bit stream by chirp spread spectrum demodulation to generate an encoded bit stream, decode the encoded bit stream to remove indexing and generate an interleaved bit stream, de-interleave the interleaved bit stream, and decode the interleaved bit stream to recover the bit stream of sensor signals.

In another exemplary embodiment, a method is described for compressive sensing based communications of low range (LoRa) devices in a low power wide area network (LPWAN), comprising receiving, by a physical layer of a LoRa device, a bit stream of sensor measurements at an incoming velocity, encoding the bit stream to generate an encoded bit stream, modulating the encoded bit stream by chirp spread spectrum modulation to generate a chirp modulated encoded bit stream, forming a first transmission packet including at least a preamble, the chirp modulated encoded bit stream and a cyclic redundancy check (CRC), receiving the first transmission packet by a multiple access layer (MAC) of the LoRa device, compressing the chirp modulated encoded bit stream of the first transmission packet into sparse vectors, combining the sparse vectors with a linear combination of a randomly selected set of sparse vectors representing past measurements and the in-coming velocity of the bit stream to generate a payload, forming a second transmission packet including the preamble, the payload and the cyclic redundancy check, transmitting the second transmission packet at a randomly selected time.

In another exemplary embodiment, a method for decoding compressive sensing based communications of low range (LoRa) devices in a low power wide area network (LPWAN), comprising receiving, at a receiver physical layer, a compressed, encoded transmission packet from a LoRa device, de-mapping the transmission packet to recover a compressed, encoded bit stream, reconstructing, by a sparse recovery sub-layer of a receiver multiple access layer (MAC) layer, the encoded transmission by recovering sparse vectors to generate a chirp spread spectrum encoded bit stream, demodulating the chirp spread spectrum encoded bit stream by chirp spread spectrum demodulation to generate an encoded bit stream, decoding the encoded bit stream to remove indexing and generate an interleaved bit stream, de-interleaving the interleaved bit stream, and decoding the interleaved bit stream to recover the bit stream of the communications.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
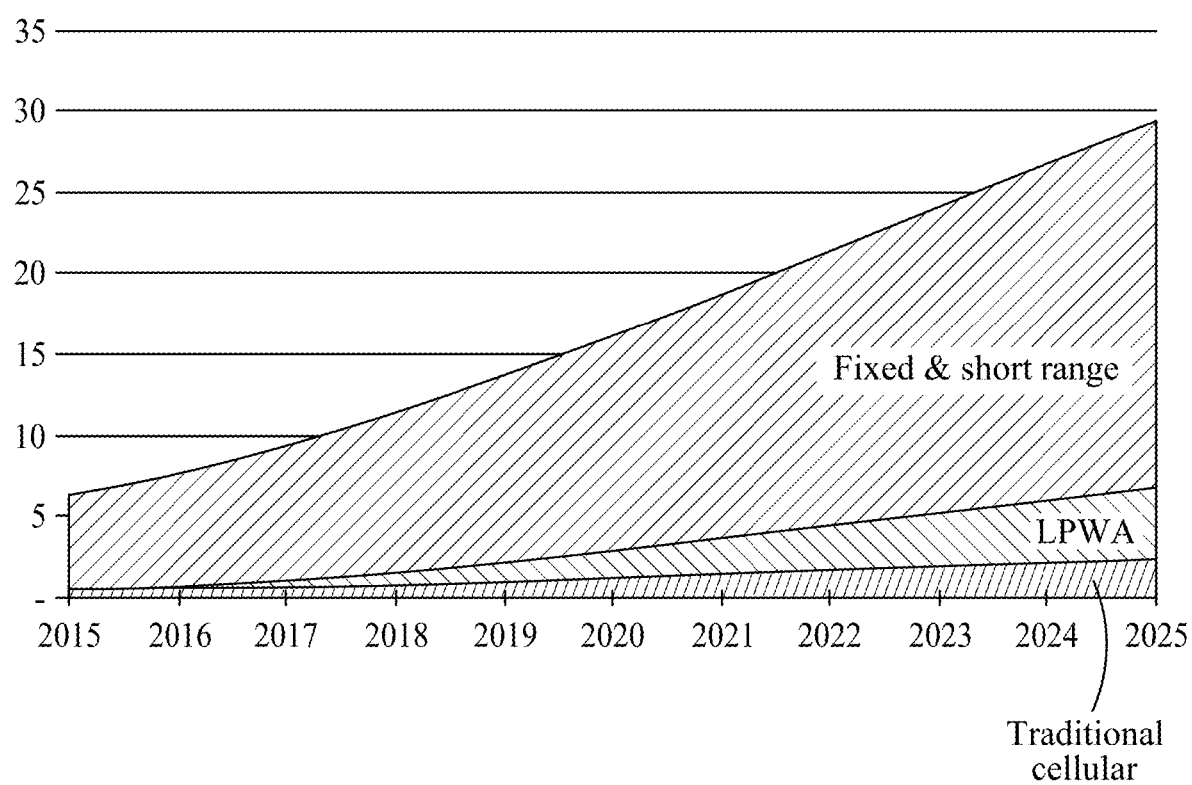
FIG. 1 is a graph illustrating the number of connection devices.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

LPWAN refers to a low power wide area network. LoRa (long range) is a low power, long range communication network protocol used in an LPWAN.

In IEEE 802 local area networks (LAN) standards, the medium access control (MAC) sublayer is a layer that controls the hardware responsible for interaction with the wireless transmission medium. The MAC sublayer provides flow control and multiplexing for the transmission medium.

The physical layer (PHY) defines the apparatus and means of transmitting raw bits over a physical data link connecting network nodes. The bitstream may be grouped into code words or symbols and converted to a physical signal that is transmitted over a transmission medium. The physical layer provides an electrical, mechanical, and procedural interface to the transmission medium. The shapes and properties of the electrical connectors, the frequencies to broadcast on, the line code to use and similar low-level parameters, are specified by the physical layer. The MAC control block is connected to the PHY via a media-independent interface.

When sending data to another device on the network, the MAC sublayer encapsulates higher-level frames into frames appropriate for the transmission medium (i.e. the MAC adds a preamble and adds a frame check sequence (CRC) to identify transmission errors), and then forwards the data to the physical layer (PHY) of the other device as soon as the appropriate channel access method permits it.

Aspects of this disclosure are directed to a system for communicating in a low power wide area network (LP-WAN), a method for compressive sensing based communications of LoRa devices in a LPWAN and a method for decoding compressive sensing based communications of LoRa devices in a LPWAN.

Figure 2:
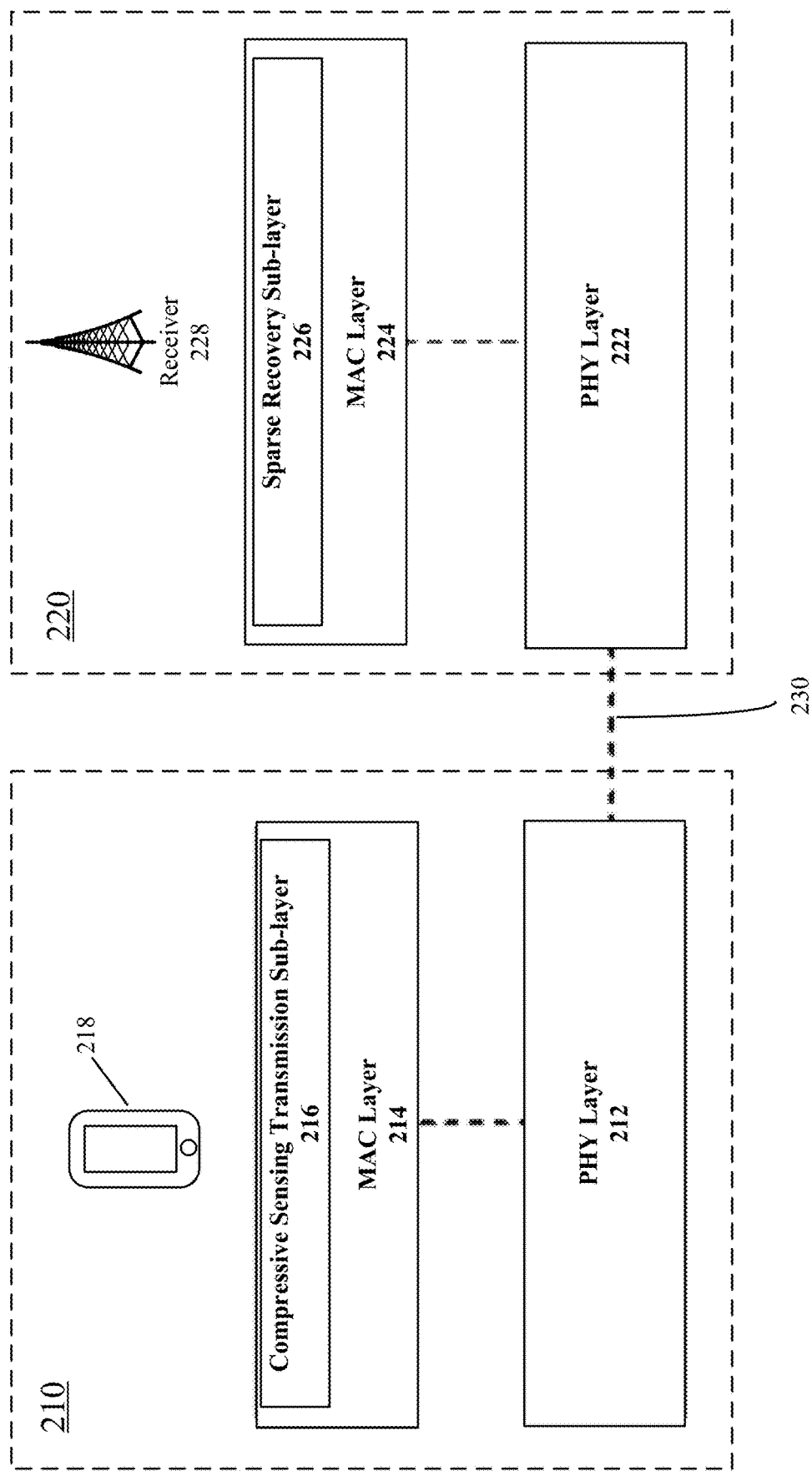
FIG. 2 is a graph illustrating the proposed system model including both the MAC layer as well as the PHY layer.

A system for compressive sensing based communications integrated with LoRa devices 200 is illustrated in FIG. 2, where the architecture at each of the device 218 side 210 and the receiver 228 side 220 can be divided into two main layers, a Physical (PHY) layer (212 on LoRa device side and 222 on receiver side) and a Multiple Access (MAC) layer (214 at the LoRa device side and 224 at the receiver side). The communications channel 230 connects the physical layers of the LoRa device side 210 and the receiver side 220. On the device side, the MAC layer 214 includes a compressive sensing transmission sub-layer 216 and at the receiver (e.g., base station 228), the MAC layer 224 includes a sparse recovery sub-layer 228. The LoRa device includes a first computer processing unit including a computer-readable medium comprising program instructions, executable by a first processing circuitry, to cause the first processing circuitry to perform the encoding, modulation, compression and transmit a transmission packet of the LoRa signals. The receiver includes a second computer processing unit including a computer-readable medium comprising program instructions, executable by a second processing circuitry, to cause the second processing circuitry to receive, decompress, demodulate and decode the received transmission packet to recover the sensor signals.

LoRa is a physical layer implementation which employs chirp spread spectrum (CSS) modulation. To generate chirps, the phase of an oscillator is modulated. The number of times per second that the phase is adjusted is called the chip rate and defines the modulation bandwidth. Chip rate is a direct subdivision of the oscillation frequency (e.g. 32 MHz). Basic chirps are simply a ramp from $f_{min}$ to $f_{max}$ (up-chirp) or $f_{max}$ to $f_{min}$ (down-chirp), where f represents frequency. Data carrying chirps are chirps that are cyclically shifted, and this cyclical shift carries the information. The chirps modulate the information by varying its content linearly with the frequency within the available bandwidth. CSS provides the transmitted signal with resilience against noise, fading and interference.

Figure 3:
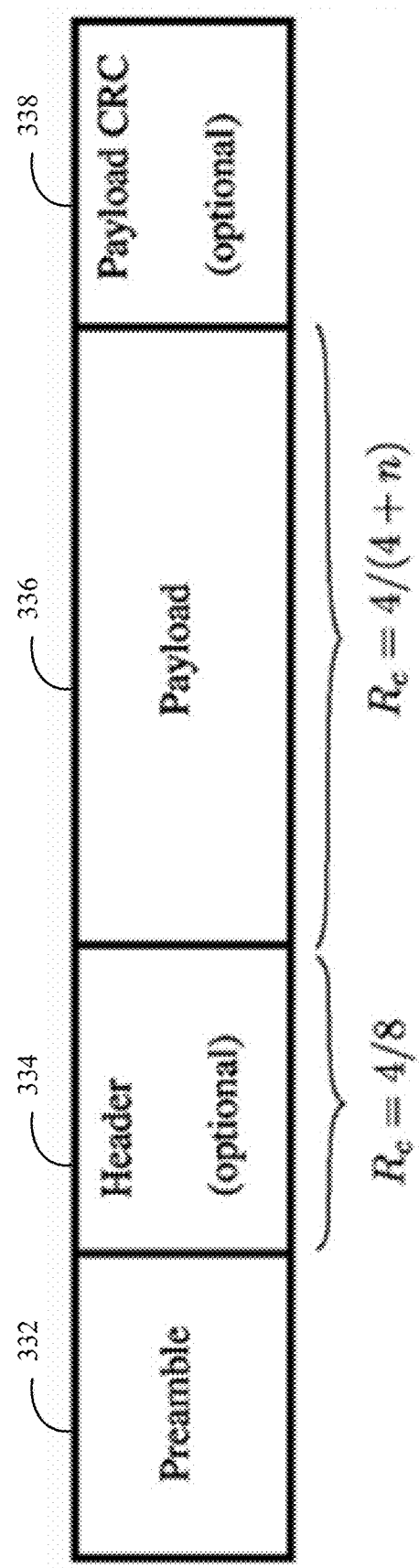
FIG. 3 illustrates LoRaWAN physical layer packet format.

FIG. 3 illustrates the format for a LoRa PHY layer packet 300. The packets to be transmitted, known as LoRaWAN packets, start with 8 chirps of preamble 332 as shown in FIG. 3. The preamble synchronizes the transmitter (e.g., device 218, FIG. 2) with the receiver (e.g., base station 228, FIG. 2). An incoming (through sensed measurements) bit sequence is modulated into chips, where multiple chips are encoded into a chirp. The number of modulated data bits depends on a Spreading Factor (SF) parameter. For example, using a SF=9, $2^9$ possible symbols can be encoded into a single chirp. A higher SF improves the signal resilience, but high resilience comes at the expense of more Time on Air (ToA), which reduces the overall throughput.

The payload 336 is the information which communicated between the transmitter and receiver.

For the system to adapt to the wireless channel quality, LoRa controls the bandwidth and the coding rate (Rc). Three available bandwidths of 125 kHz, 250 kHz and 500 kHz as well as four Rc of 4/5, 4/6, 4/7 or 4/8 can be selected to match the channel conditions. FIG. 3 shows an optional header 334 having a coding rate of Rc=4/8, which encodes a payload 336 with a coding rate of $R_c=4/(4+n)$ where n={1,2,3,4}. Additionally, the LoRa packets contain an optional payload Cyclic Redundancy Check (CRC) 338, which is used for error detection. The CRC field is only present in uplink transmissions.

Figure 4:
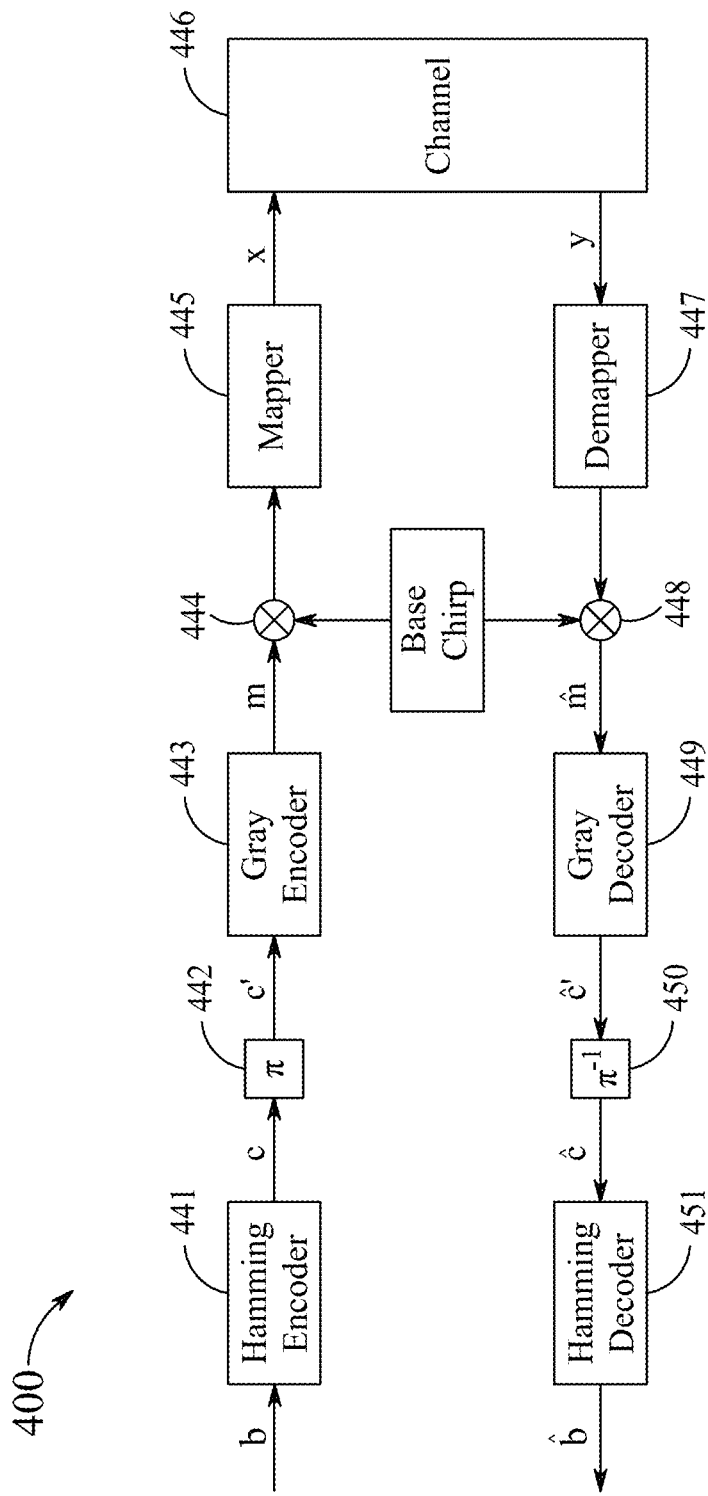
FIG. 4 is a schematic diagram of LoRa PHY layer.

A block diagram of the LoRa PHY layer 212 encoding/decoding sequence 400 is shown in FIG. 4, where an input bit sequence (b) is encoded using a Hamming Encoder 441 with Hamming Forward Error Correction (FEC) at a coding rate of $R_c=4/(4+n)$ where n={1,2,3,4} to generate a coded bit sequence (c). The use of a Hamming code allows the system to detect and correct any corrupted bits. Next, the encoded bit sequence (c) is interleaved by interleaver π at 442 in order to add more resilience to the transmitted single against bursts of interference. The interleaved signal is output at (c'). A Gray encoder 443 applies Gray indexing which prevents off-by-one errors when resolving symbols. Next the encoded sequence (m) is modulated at 444 with a base chirp using CSS, and mapped at 445 to be transmitted at (x) to channel 446 after encoding.

In a non-limiting example, the mapper may be a differential phase shift keying (DQPSK) mapper, which maps the transmission packet to in-phase and quadrature phase transmission paths (ultimately antennas) to be transmitted later by the physical layer.

A receiver path is shown in which a received signal (y) is demapped at 447, mixed with the base chirp at 448 to generate m̂, Gray decoded at 449 to generate ĉ', de-interleaved by de-interleaver $\pi^{-1}$ at 450 to generate ĉ and Hamming decoded at 451 to generated a decoded bit sequence b̂. Hardware and software for both the uplink and downlink paths can be included in the LoRa device and at a receiver in the base station. The receiver may reply or otherwise communicate with the LoRa device, which is received as signal y on the receiver path.

Figure 5:
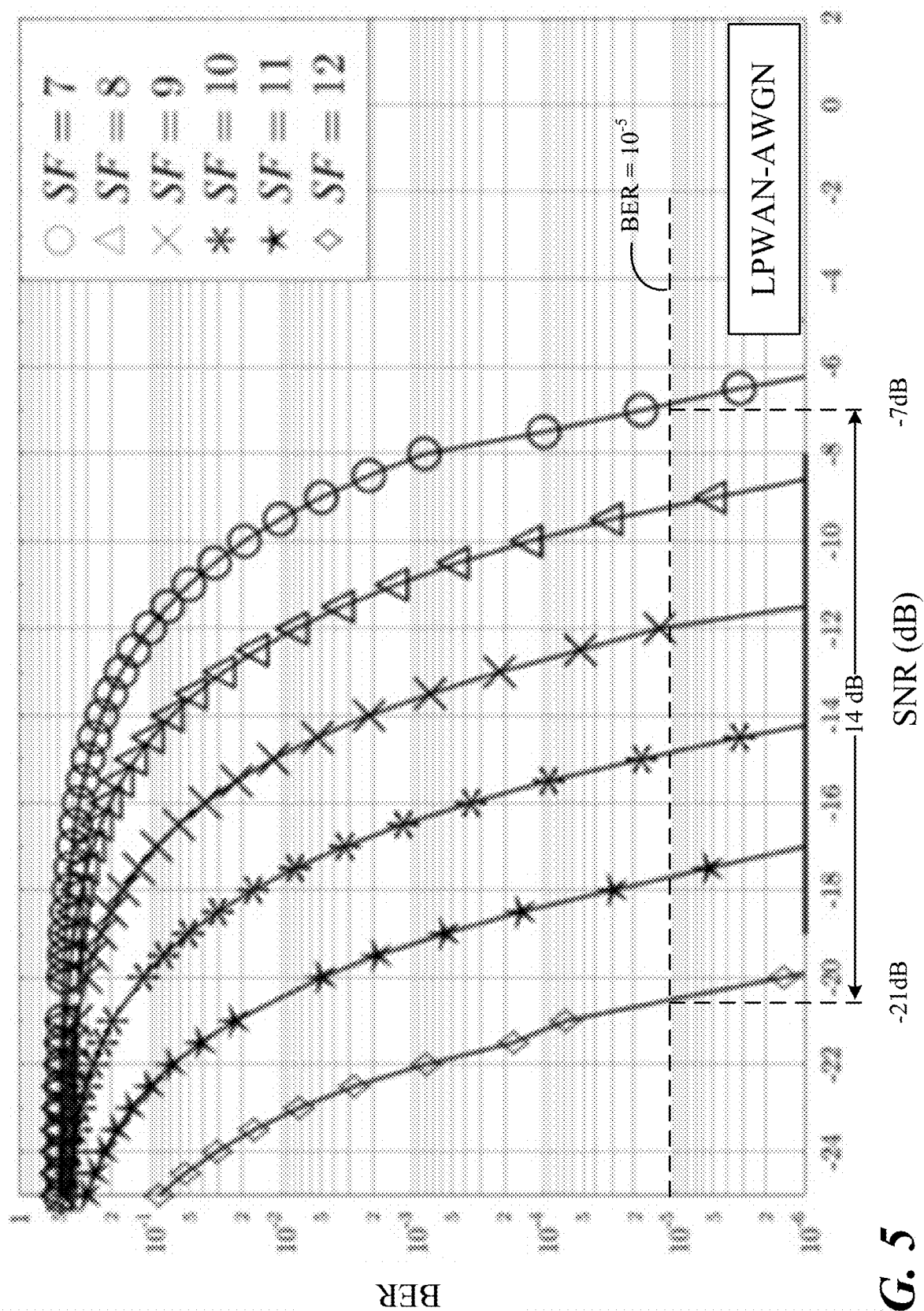
FIG. 5 illustrates the bit error ratio (BER) performance of the LoRa chirp spread spectrum (CSS) modulation.

FIG. 5 shows a graph of the Bit Error Ratio (BER) vs. SNR for the LoRa PHY CSS modulation of the physical layer of FIG. 4, where the signals were transmitted into an additive white Gaussian noise (AWGN) channel.

As shown in FIG. 5, increasing (from SF=7 to SF=12) the spreading factor (SF) leads to better performance (lower BER, from $10^{-6}$ to $10^{-20}$) where an approximate value SNR of −21 dB is needed to attain a BER performance of $10^{-5}$ for SF=12. However, an extra 14 dB is required to achieve similar performance when reducing the SF to 7.

However, this significant performance improvement comes with the expense of lower overall data rate, i.e. less spectrum efficiency.

Returning to FIG. 2, after the data of the physical layer 212 is encoded as shown in FIG. 4, the data is encapsulated at the MAC layer 214. The packet is received from/passed to the physical layer as a group of bits which are handled in the MAC layer as follows: Let $x_i$ be an N×1 actual source measurement vector at time i, which can be considered over an interval of interest. Time notation is used to indicate that $x_i$ represents a small part of an infinite streaming source vector. It is assumed that $z_i$ is the corresponding sparse vector (a vector having mostly elements equal to zero) of $x_i$ in the discrete cosine transform (DCT) domain. Therefore, the vector $x_i$ can be represented as $x_i = \Psi z_i$, where $\Psi$ is the basis at which $x_i$ is sparse. In a slotted Aloha-based transmission, sampling is ideally performed as $$y_i = \Lambda x_i \quad (1)$$

where $\Lambda$ is an N×N identity sampling matrix. The identity matrix results in transmission of all elements of the velocity vector and reflects periodic transmission where the transmitted vector in this case is $y_i = x_i$.

In the compressive sampling based sub-layer 216 of MAC layer 214, instead of transmitting samples periodically, each device transmits its current measurement and a linear combination of the past measurements in the observation window (i.e., those measurements will be compressed of over the window of time). Therefore, each transmission has the form:

$$u_i = [h_n, y_{nj}]^T, \quad (2)$$

where $h_n$ is the current actual measurement at time n, and $y_{nj}$ is a random combination of the past measurements at the frame time n and the MAC framer $j^{th}$ time slot.

Let the length of the MAC frame be F, and the number of repetitions at a MAC frame be α. That is, there would be α transmissions at the MAC frame as $[y_{n1}, \ldots, y_{n\alpha}]$ with the actual measurement value, $h_n$, where it is assumed that $h_n$ does not change significantly within the MAC time frame (e.g., 100 ms). For such a MAC, $$w = \frac{a}{F}$$

is the retransmission rate. Each sample $y_{nj}$ has the form:

$$y_{nj} = \sum_{t=1}^{n} \phi_{tj} x_t, \quad (3)$$

where $\phi_{tj}$ is the weight for the linear combination. Each $\phi_{tj}$ is a random number that is drawn from a Gaussian distribution and $x_t$ is the actual velocity value at time t.

There are three main parameters in this system, i.e., the length of the observation window, the number of sampled packets, and the estimation time at the receiver. Given the above three design parameters, each device should transmit a vector $y_i$ of length αM, where M is a set of m measurements selected randomly from the N measurements, as $$y_i = \Phi_i x_i \quad (4)$$

where $\Phi_i$ is an αM×N (where αM<<N) sampling matrix, and subscript i indicates the vector of αM linearly combined measurements at time i corresponding to the vector $x_i$. The sampling matrix, $\Phi_i$, defines the transmission strategy and reduces the dimensionality of the transmitted measurement vector. From compressive theory, if αM≈c log(N), where c is a constant that can be easily determined, the velocity vector can be thoroughly reconstructed. (See E. J. Candes, M. Wakin, "An introduction to compressive sampling", IEEE Signal Process. Mag., Vol. 25, No. 2, pp. 21-30, 2008; and Ju Wang, Xiaojiang Chen, Dingyi Fang, Chase Qishi Wu, Zhe Yang, and Tianzhang Xing; "Transferring compressive sensing-based device free localization across target diversity". IEEE Trans. on Industrial Electronics, 62(4): 2397-2409, 2015, each incorporated herein by reference in their entirety). The transmitted vector can also be written as:

$$y_i = \Phi_i \Psi z_i \quad (5)$$

Where $\Psi$ is the basis of the sparse domain as explained above. Let $Y_n = [y_i, \ldots, y_n]$. Each node will transmit, at a randomly sampled time at the MAC layer, the following: $U_i = [h_n, Y_n]^T$, where $U_i$ contains the compressed sensing data $Y_n$ and the actual measurement at the time instant $_n$.

Ideally, α=1, but for reliability α can be increased if needed, but increasing a may congest the channel.

At the receiver 228, the MAC layer 224 includes a sparse recovery sublayer 226, in which the sparse vector $z_t$ can be reconstructed with a high probability by:

$$\hat{z}_t = \text{argmin} \|z_t\|_1 \quad (6)$$
$$\text{subject to } y_n = \Phi_t \Psi z_t$$

where $\hat{z}_t$ is the estimated value of the sparse values. This type of estimator is shown to be excellent for sparse measurements. This estimation can be performed for each MAC frame separately, or jointly for multiple MAC frames, which adds a higher complexity at the receiver, and larger delay to wait for the frames. That is, the estimation complexity is directly related to the length of the estimated vector. If a small vector is estimated, smaller computation and search time should. The larger the MAC frames accumulate, the better the estimation becomes. However, the computation delay increases.

Figure 6:
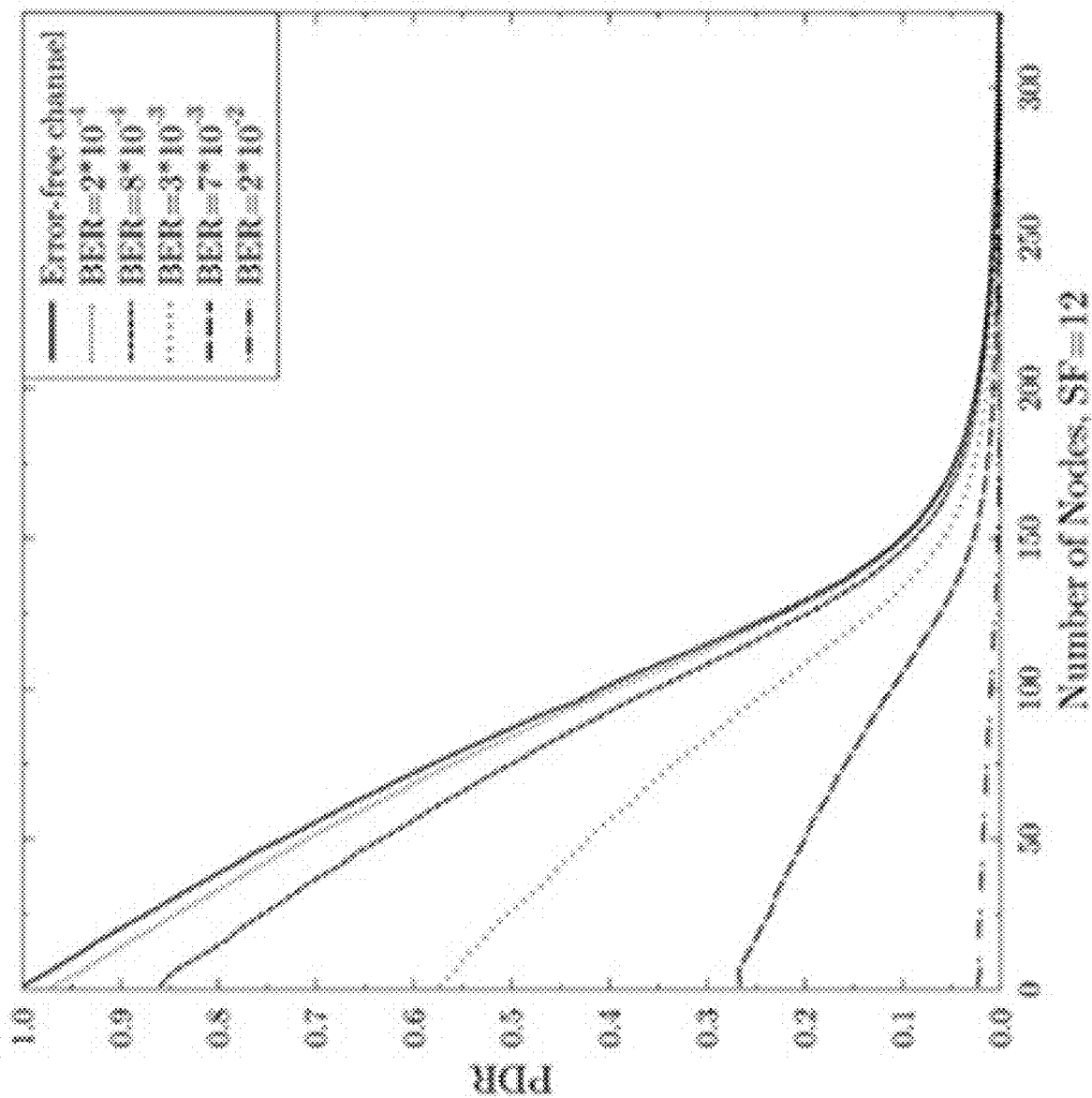
FIG. 6 is a graph illustrating the effective packet delivery ratio (PDR) when using SF=12.

FIG. 6 shows that as BER becomes smaller, the Packet Delivery Ratio (PDR) increases. This result is expected as more bits are lost, and a packet is (ideally) considered lost if one or more of its bits are lost. The LoRa system of the present disclosure moves one of the PDR curves closer to high values given the compressive sensing parameters discussed above. Experiments and simulations conducted show that these values to depend on the ratio of the compression and the random transmission of ALOHA.

Figure 7:
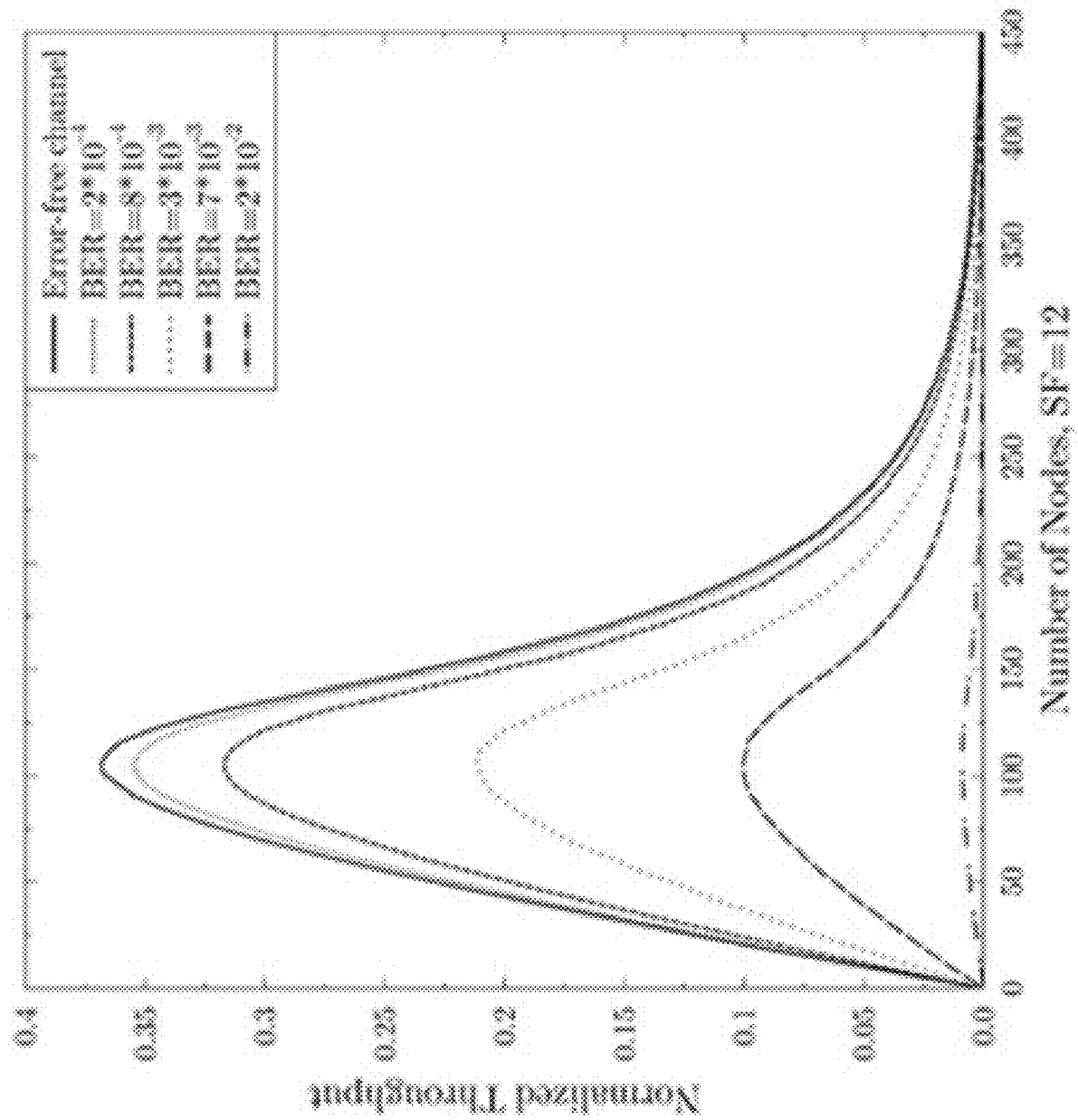
FIG. 7 is a graph illustrating the normalized throughput when using SF=12.

FIG. 7 shows the MAC layer performance in terms of normalized throughput per number of nodes at SF=12 for different channel BER values. It is clear that the error-free channel provides the best throughput, as expected. Moreover, as the error rate increases, the throughput decreases. The compressive sensing scheme of the present disclosure reduces the number of transmitted packets while making the number of successfully received packets larger. Therefore, it should result generally in smaller values before the compared peak of the compared chosen curve, but in larger or similar values after the peak of the chosen curve.

In summary, LoRa is one the main LPWAN technologies, due it its unique properties of:
 (i) Ultra-long distance range.
 (ii) Low cost and complexity devices.
 (iii) Long lifetime of nodes.
 (iv) Concurrent reception capacity of gateways.

Hence, there is an enormous number of existing real-life use cases where LoRa networking is used. The stringent requirements of restricted of duty-cycle can lead to a very limited data rate, therefore compressive sensing techniques as described in the present disclosure are combined with the LoRa system in order to increase the data rate and employ the combined system in applications such as accurate localization, image and video transmissions without adding extra complexity to the battery-powered sensors.

Figure 8:
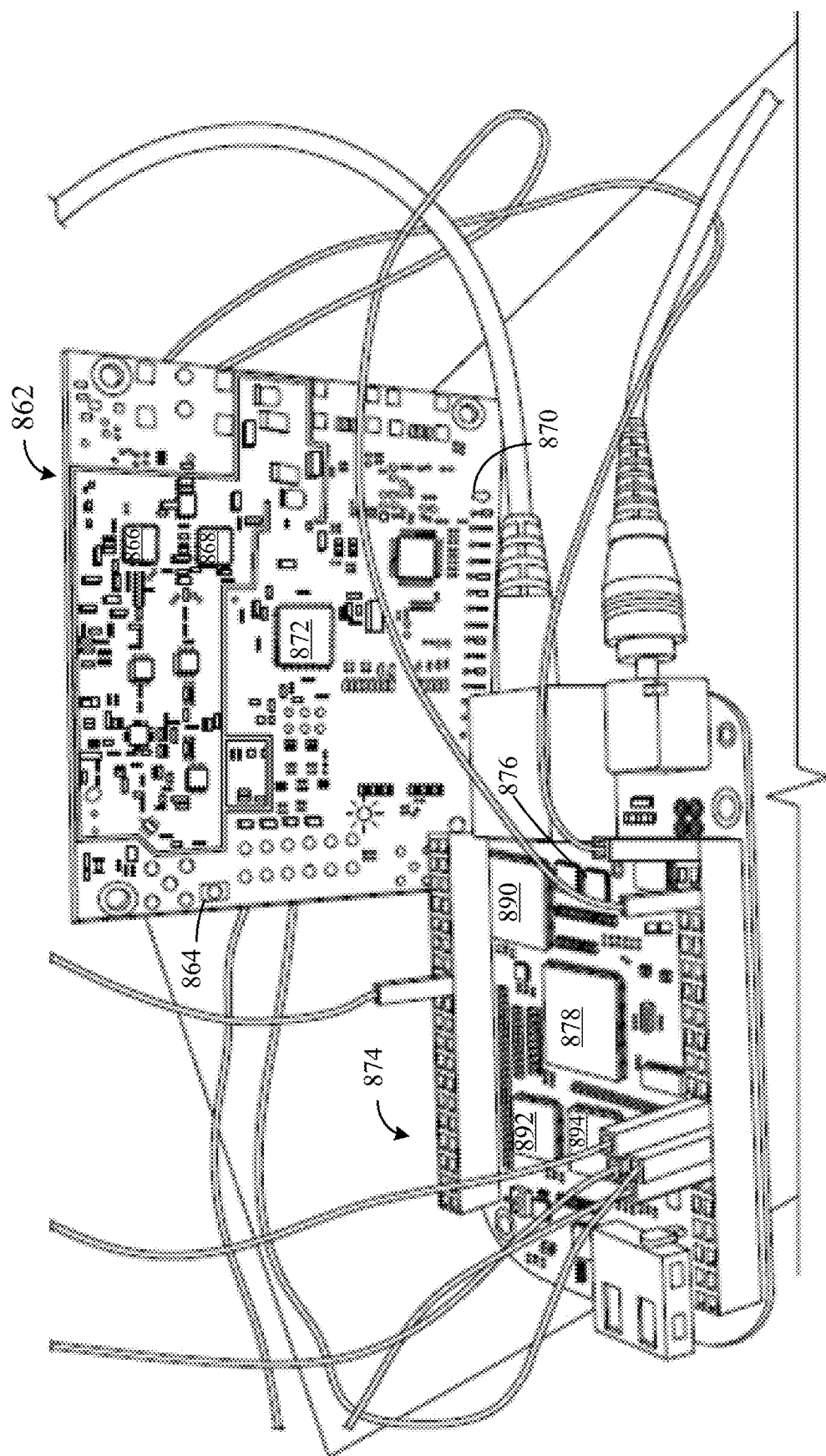
FIG. 8 illustrates an iC880A-LoRaWAN® Concentrator 868 MHz.

A prototype circuit, shown in FIG. 8, was built to test the compressive sensing-based LPWAN MAC layer integrated with LoRa of the present disclosure. The prototype circuit of FIG. 8 includes a receiver concentrator 862 which is capable of receiving an 8 LoRa® transmission simultaneously sent with different spreading factors and also on different channels. The main components of the receiver are an antenna connector 864, a first 866 and a second radio 868, a GPS PPS input 870, and a microprocessor 872.

In a non-limiting example, the concentrator 862 may be part number iC880A, available from Wireless Solutions, Carl-Friedrich-Gauss-Str. 2-4, 47475 Kamp-Lintfort, Germany, world wide web.wireless-solutions.de/products/lora/radio-modules/ic880a-spi/, incorporated herein by reference in its entirety. The concentrator 862 is integrated with an circuit board 874 having an Ethernet modem 876 and includes a processor 878 to arrange the received packets before forwarding them to the server. Memory 892 and DDR3 SDRM memory 894 and an HDMI framer 892 are included on the circuit board. In a non-limiting example, the circuit board may be the BeagleBone Black, world wide web.elinux.org/Beagleboard:BeagleBoneBlack, incorporated herein by reference in its entirety.

Figure 9:
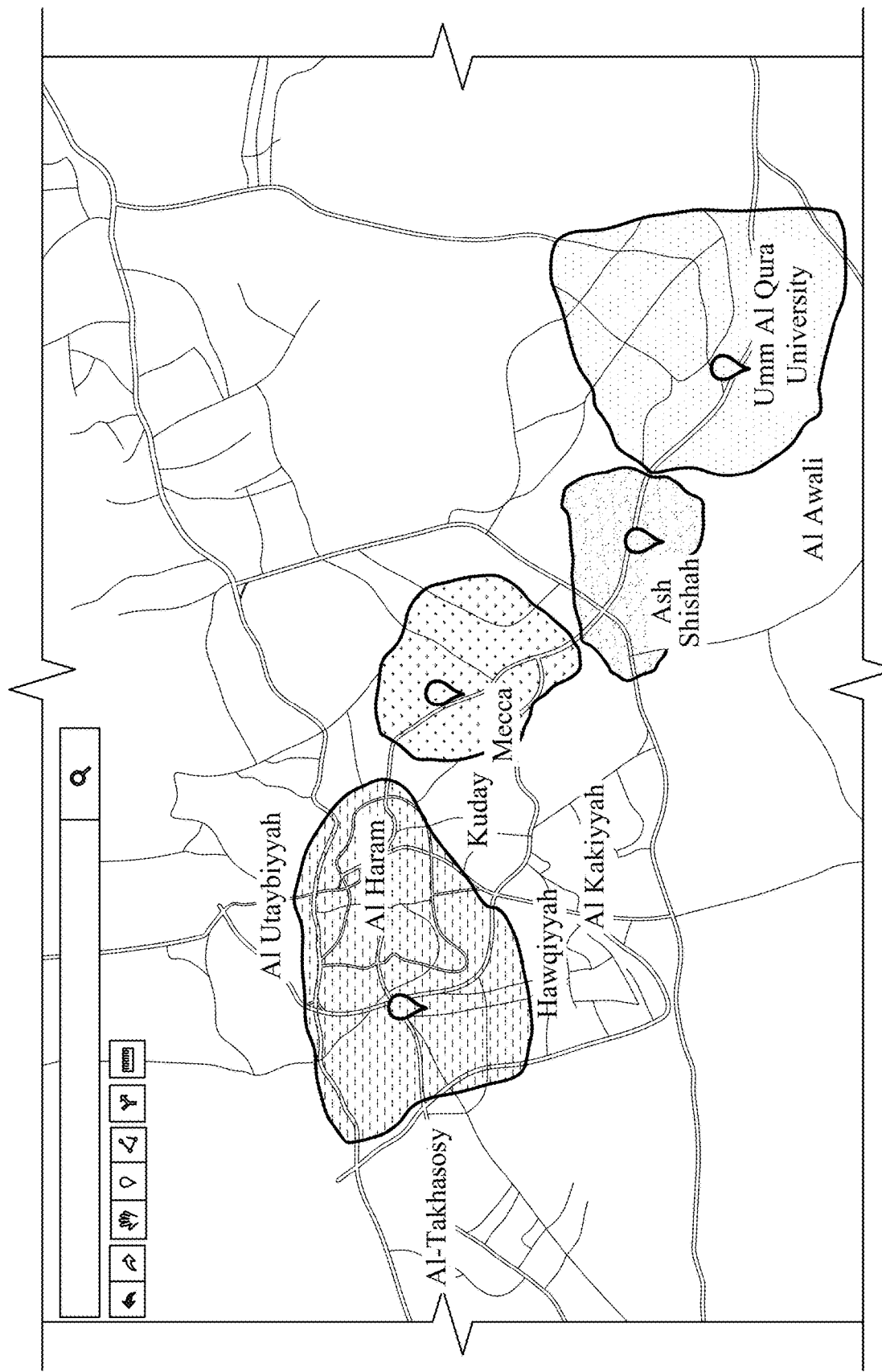
FIG. 9 is a map illustrating the LoRa gateway coverage in a city.

A LoRa field study was conducted in which the city of Makkah in Saudi Arabia was covered using as few as four gateways including the prototype circuit. FIG. 9 illustrates the coverage in four regions.

Figure 10:
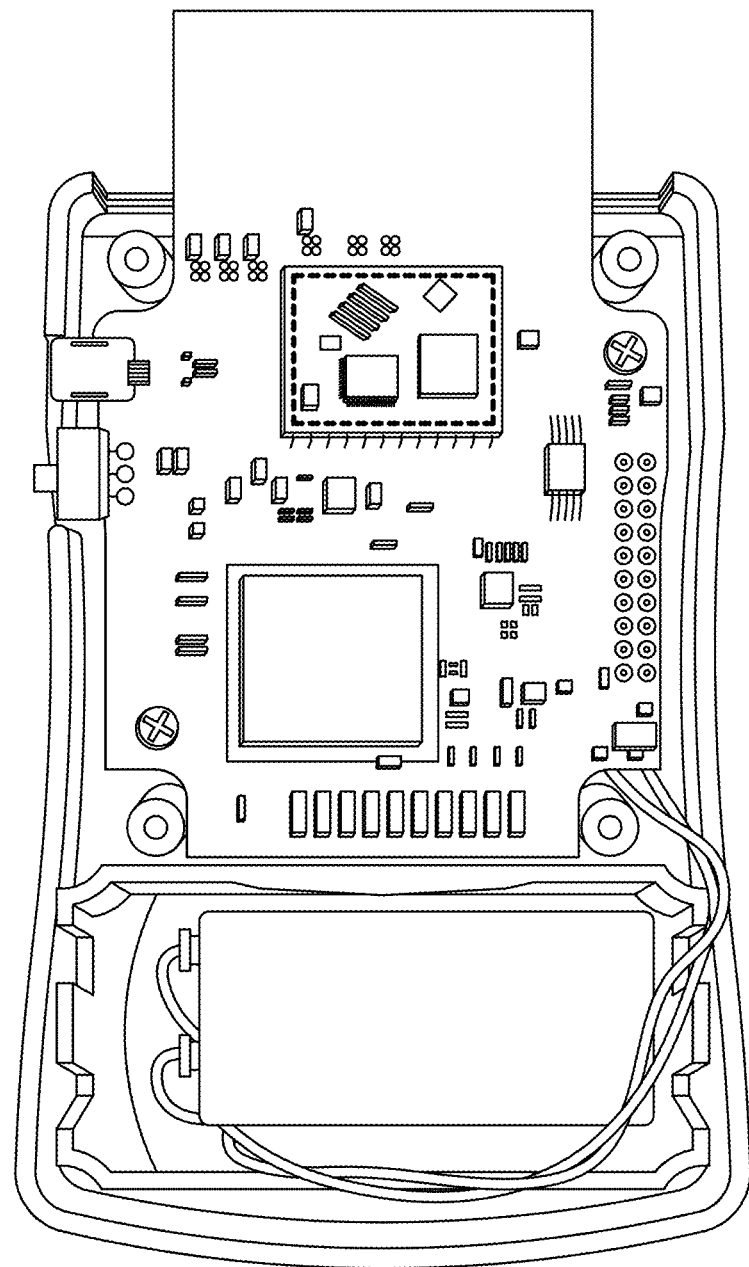
FIG. 10 illustrates a prototype development board.

The compressive sensing-based system LPWAN MAC layer integrated with LoRa communications system may be integrated in a device which includes sensors such as an accelerometer, an altimeter, and a temperature sensor. A GPS module may be included for location accuracy. FIG. 10 shows a prototype sensor including the physical, MAC and Compressive sensing transmission sublayer of FIG. 2.

A simulation was conducted of the system. As shown in FIG. 5-7, the simulation results show a significant reduction of the number of transmitted frames that are required for full information exchange while maintaining a low-level of source complexity.

The first embodiment is illustrated with respect to FIGS. 1-14. The first embodiment describes a system 200 for communicating in a low power wide area network (LPWAN), comprising a long range (LoRa) sensing device 218 having circuitry including at least one sensor configured to generate bit stream of sensor signals, a first physical layer (PHY) 212, a first medium access (MAC) layer 214, a compressive sensing-aided transmission sub-layer 216 embedded within the first medium access layer, a first computer processing unit (not shown) including a computer-readable medium comprising program instructions, executable by a first processing circuitry, to cause the first processing unit to receive, at the first physical layer of a LoRa device, the bit stream of sensor signals at an incoming velocity, encode the bit stream to generate an encoded bit stream, modulate the encoded bit stream by chirp spread spectrum modulation to generate a chirp modulated encoded bit stream, form a first transmission packet including at least a preamble, the chirp modulated encoded bit stream and a cyclic redundancy check (CRC), receive the first transmission packet by the first multiple access layer (MAC) of the LoRa device, compress the chirp modulated encoded bit stream of the first transmission packet into sparse vectors, combine the sparse vectors with a linear combination of a randomly selected set of sparse vectors representing past measurements and the in-coming velocity of the bit stream to generate a payload, form a second transmission packet including the preamble, the payload and the cyclic redundancy check, transmit, by the first physical layer, the second transmission packet at a randomly selected time. The system further includes a receiver 228 having circuitry including a second physical layer (PHY) 222, a second medium access (MAC) layer 224, a sparse recovery sub-layer 226 embedded within the second MAC layer, a second computer processing unit (not shown) including a computer-readable medium comprising program instructions, executable by a second processing circuitry, to cause the second processing unit to receive, at the second physical layer, the second transmission packet, de-map the transmission packet to recover a compressed, encoded bit stream, reconstruct, by the sparse recovery sub-layer, the compressed, encoded bit stream by recovering sparse vectors to generate a chirp spread spectrum encoded bit stream, demodulate the chirp spread spectrum encoded bit stream by chirp spread spectrum demodulation to generate an encoded bit stream, decode the encoded bit stream to remove indexing and generate an interleaved bit stream, de-interleave the interleaved bit stream, and decode the interleaved bit stream to recover the bit stream of sensor signals.

The system further includes a Hamming encoder 441, a Gray indexer 442 and the first processing circuitry is further configured to encode the bit stream, with the Hamming encoder, by using Hamming forward error correction to form a first coded bit sequence, interleave (see interleaver 442) the first coded bit sequence to form a second coded bit sequence, and apply Gray indexing to the second coded bit sequence to prevent off-by-one errors when resolving symbols to generate the encoded bit stream.

The system further includes a local oscillator (not shown) configured to generate a base chirp signal 445, wherein the first processing circuitry is further configured to modulate the encoded bit stream by combining the encoded bit stream with the base chirp signal at a chirp rate.

The system further includes wherein the first processing circuitry is further configured to select a channel bandwidth from the group consisting of 125 kHz, 250 kHz and 500 kHz, match a coding rate to a channel coding rate, wherein the coding rate is selected from $$R_c = \frac{4}{4+n} \text{ where}$$
$$n = \{1, 2, 3, 4\},$$

and encode the signal bits by using Hamming forward error correction at the coding rate.

The system further includes wherein the first processing circuitry is further configured to compress the chirp modulated encoded bit stream of the first transmission packet into sparse vectors by retaining only non-zero values of the sparse vectors.

The system further includes wherein the first processing circuitry is further configured to map the second transmission packet to in-phase and quadrature transmission paths, and transmit the second transmission packet on the in-phase and quadrature transmission paths.

The system further includes wherein the first processing circuitry is further configured to transmit the second transmission packet according to a Class A protocol, in which the LoRa device sleeps until it wakes for transmission at the randomly selected time.

The system further includes wherein the second processing circuitry is further configured to demodulate the chirp spread spectrum encoded bit stream by subtracting a base chirp signal generated by a local oscillator at a chirp rate from the chirp spread spectrum encoded bit stream.

The system further includes a Gray decoder 449 configured to decode the encoded bit stream, and a Hamming decoder 451 configured to decode the interleaved bit stream.

The second embodiment is illustrated with respect to FIG. 1-14. The second embodiment describes a method for compressive sensing based communications of low range (LoRa) devices in a low power wide area network (LPWAN), comprising receiving, by a physical layer of a LoRa device, a bit stream of sensor measurements at an incoming velocity, encoding the bit stream to generate an encoded bit stream, modulating the encoded bit stream by chirp spread spectrum modulation to generate a chirp modulated encoded bit stream, forming a first transmission packet including at least a preamble, the chirp modulated encoded bit stream and a cyclic redundancy check (CRC), receiving the first transmission packet by a multiple access layer (MAC) of the LoRa device, compressing the chirp modulated encoded bit stream of the first transmission packet into sparse vectors, combining the sparse vectors with a linear combination of a randomly selected set of sparse vectors representing past measurements and the in-coming velocity of the bit stream to generate a payload, forming a second transmission packet including the preamble, the payload and the cyclic redundancy check, transmitting the second transmission packet at a randomly selected time.

The method of the second embodiment further comprises encoding the bit stream by encoding the bits with a Hamming encoder, by using Hamming forward error correction to form a first coded bit sequence, interleaving the first coded bit sequence to form a second coded bit sequence, and applying Gray indexing to the second coded bit sequence to prevent off-by-one errors when resolving symbols to generate a third coded bit sequence.

The method of the second embodiment further comprises modulating the encoded bit stream by combining the third coded bit sequence with a base chirp signal generated by a local oscillator at a chirp rate.

The method of the second embodiment further comprises selecting a channel bandwidth from the group consisting of 125 kHz, 250 kHz and 500 kHz, matching a coding rate to a channel coding rate, wherein the coding rate is selected from and $$R_c = \frac{4}{4+n} \text{ where}$$
$$n = \{1, 2, 3, 4\},$$

encoding the signal bits by using Hamming forward error correction at the coding rate.

The method of the second embodiment further comprises compressing the chirp modulated encoded bit stream of the first transmission packet into sparse vectors by retaining only non-zero values of the sparse vectors.

The method of the second embodiment further comprises mapping the second transmission packet to in-phase and quadrature transmission paths, and transmitting the second transmission packet according to the mapping.

The method of the second embodiment further comprises transmitting the second transmission packet according to a Class A protocol, in which the LoRa device sleeps until it wakes for transmission at the randomly selected time.

The third embodiment is illustrated with respect to FIG. 1-14. The third embodiment describes a method for decoding compressive sensing based communications of low range (LoRa) devices in a low power wide area network (LPWAN), comprising receiving, at a receiver physical layer, a compressed, encoded transmission packet from a LoRa device, de-mapping the transmission packet to recover a compressed, encoded bit stream, reconstructing, by a sparse recovery sub-layer of a receiver multiple access layer (MAC) layer, the encoded transmission by recovering sparse vectors to generate a chirp spread spectrum encoded bit stream, demodulating the chirp spread spectrum encoded bit stream by chirp spread spectrum demodulation to generate an encoded bit stream, decoding the encoded bit stream to remove indexing and generate an interleaved bit stream, de-interleaving the interleaved bit stream, and decoding the interleaved bit stream to recover the bit stream of the communications.

The method of the third embodiment further comprises decoding the encoded bit stream, with a Gray decoder, and decoding the interleaved bit stream with a Hamming decoder.

The method of the third embodiment further comprises demodulating the chirp spread spectrum encoded bit stream by subtracting a base chirp signal generated by a local oscillator at a chirp rate from the chirp spread spectrum encoded bit stream.

The method of the third embodiment further includes waking the receiver physical layer periodically to listen for messages from a LoRa transmitter in a Class A communication.

Figure 11:
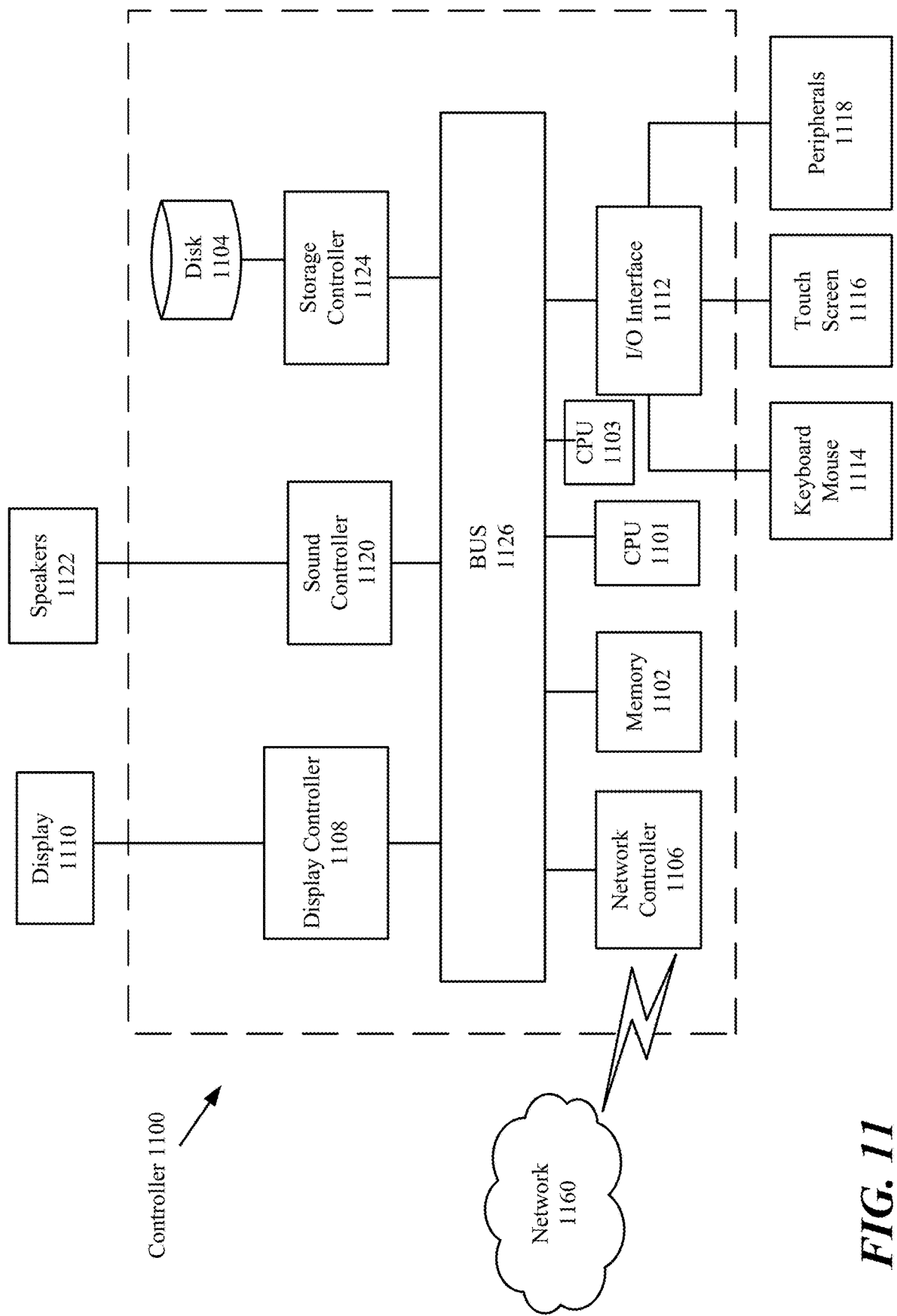
FIG. 11 is an illustration of a non-limiting example of details of computing hardware used in the computing system, according to certain embodiments.

Next, further details of the hardware description of the computing environment of FIG. 2 including a first computer processing unit in the LoRa device and a second computer processing unit in the receiver according to exemplary embodiments is described with reference to FIG. 11. In FIG. 11, a controller 1100 is described in which the controller is a computing device which includes a CPU 1101 which performs the processes described above/below. The process data and instructions may be stored in memory 1102. These processes and instructions may also be stored on a storage medium disk 1104 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1101, 1103 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 1101 or CPU 1103 may be a Xenon or Core processor from Intel of America or an Opteron processor from AMD of America, or may be other processor types that would be recognized by one of ordinary skill in the art. Alternatively, the CPU 1101, 1103 may be implemented on an FPGA, ASIC, PLD or using discrete logic circuits, as one of ordinary skill in the art would recognize. Further, CPU 1101, 1103 may be implemented as multiple processors cooperatively working in parallel to perform the instructions of the inventive processes described above.

The computing device in FIG. 11 also includes a network controller 1106, such as an Intel Ethernet PRO network interface card from Intel Corporation of America, for interfacing with network 1160. As can be appreciated, the network 1160 can be a public network, such as the Internet, or a private network such as an LAN or WAN network, or any combination thereof and can also include PSTN or ISDN sub-networks. The network 1160 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1108, such as a NVIDIA GeForce GTX or Quadro graphics adaptor from NVIDIA Corporation of America for interfacing with display 1110, such as a Hewlett Packard HPL2445w LCD monitor. A general purpose I/O interface 1112 interfaces with a keyboard and/or mouse 1114 as well as a touch screen panel 1116 on or separate from display 1110. General purpose I/O interface also connects to a variety of peripherals 1118 including printers and scanners, such as an OfficeJet or DeskJet from Hewlett Packard.

A sound controller 1120 is also provided in the computing device such as Sound Blaster X-Fi Titanium from Creative, to interface with speakers/microphone 1122 thereby providing sounds and/or music.

The general purpose storage controller 1124 connects the storage medium disk 1104 with communication bus 1126, which may be an ISA, EISA, VESA, PCI, or similar, for interconnecting all of the components of the computing device. A description of the general features and functionality of the display 1110, keyboard and/or mouse 1114, as well as the display controller 1108, storage controller 1124, network controller 1106, sound controller 1120, and general purpose I/O interface 1112 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 12.

Figure 12:
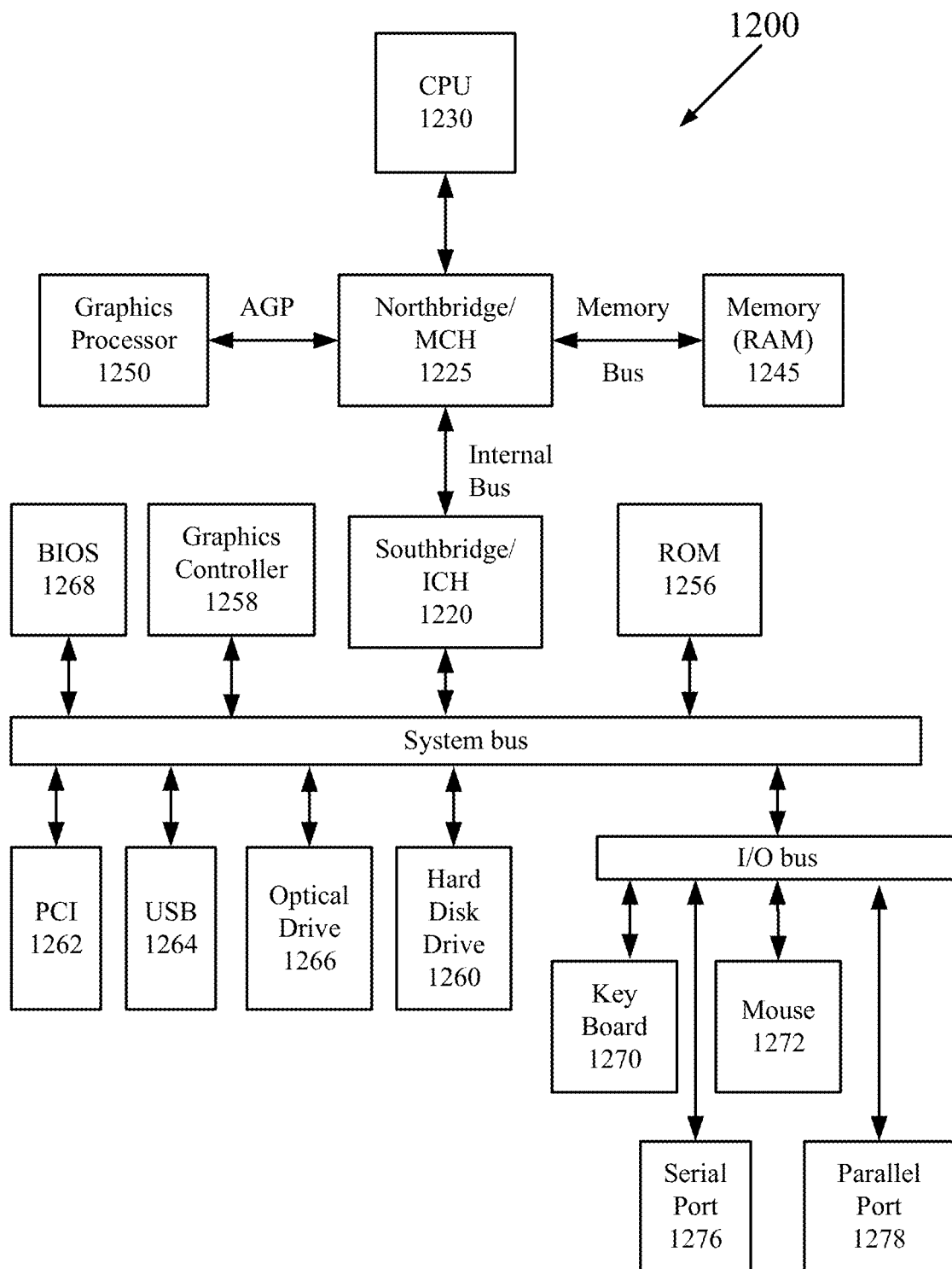
FIG. 12 is an exemplary schematic diagram of a data processing system used within the computing system, according to certain embodiments.

FIG. 12 shows a schematic diagram of a data processing system, according to certain embodiments, for performing the functions of the exemplary embodiments. The data processing system is an example of a computer in which code or instructions implementing the processes of the illustrative embodiments may be located.

In FIG. 12, data processing system 1200 employs a hub architecture including a north bridge and memory controller hub (NB/MCH) 1225 and a south bridge and input/output (I/O) controller hub (SB/ICH) 1220. The central processing unit (CPU) 1230 is connected to NB/MCH 1225. The NB/MCH 1225 also connects to the memory 1245 via a memory bus, and connects to the graphics processor 1250 via an accelerated graphics port (AGP). The NB/MCH 1225 also connects to the SB/ICH 1220 via an internal bus (e.g., a unified media interface or a direct media interface). The CPU Processing unit 1230 may contain one or more processors and even may be implemented using one or more heterogeneous processor systems.

Figure 13:
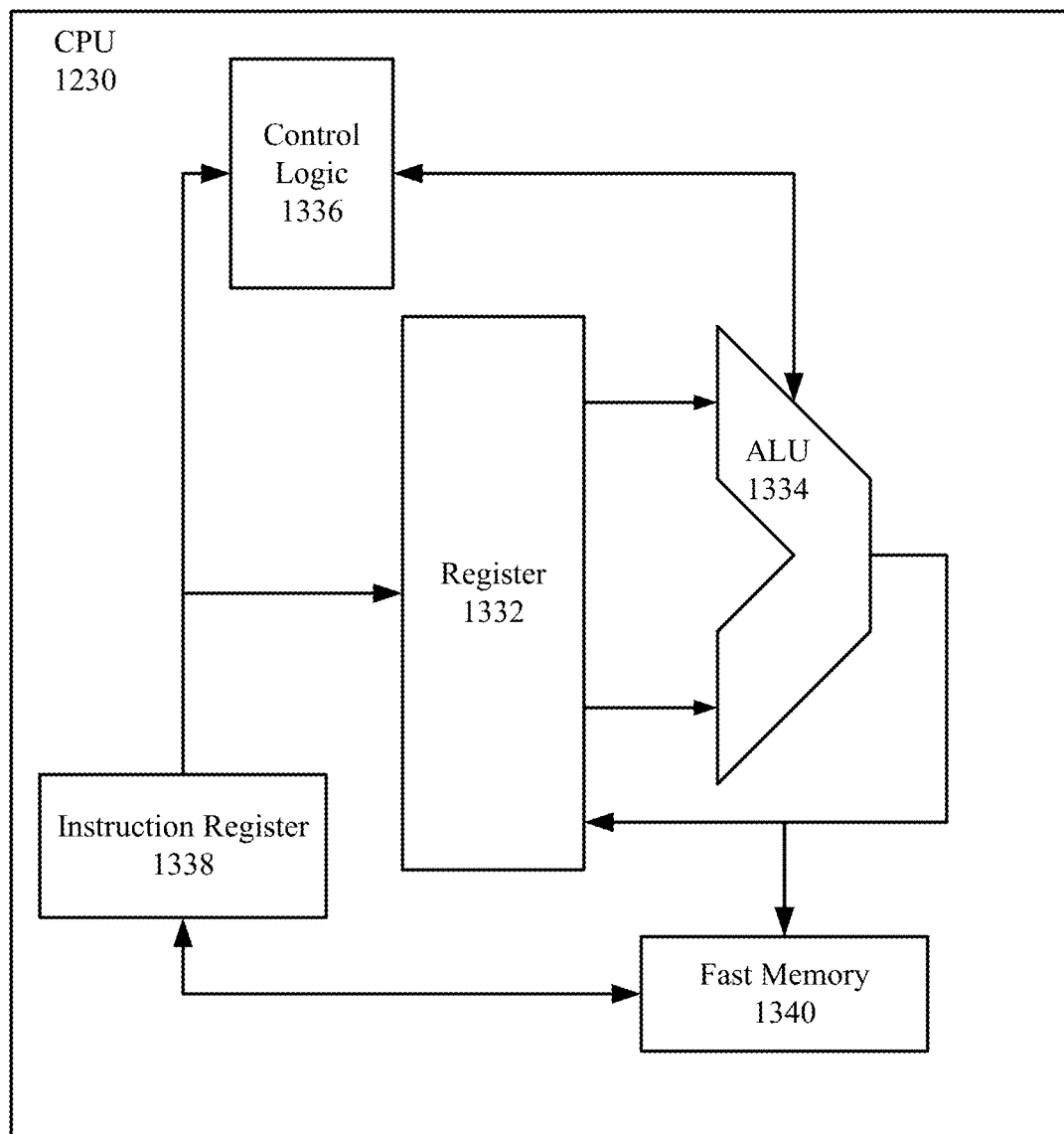
FIG. 13 is an exemplary schematic diagram of a processor used with the computing system, according to certain embodiments.

For example, FIG. 13 shows one implementation of CPU 1230. In one implementation, the instruction register 1338 retrieves instructions from the fast memory 1340. At least part of these instructions are fetched from the instruction register 1338 by the control logic 1336 and interpreted according to the instruction set architecture of the CPU 1230. Part of the instructions can also be directed to the register 1332. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1334 that loads values from the register 1332 and performs logical and mathematical operations on the loaded values according to the instructions. The results from these operations can be feedback into the register and/or stored in the fast memory 1340. According to certain implementations, the instruction set architecture of the CPU 1230 can use a reduced instruction set architecture, a complex instruction set architecture, a vector processor architecture, a very large instruction word architecture. Furthermore, the CPU 1230 can be based on the Von Neuman model or the Harvard model. The CPU 1230 can be a digital signal processor, an FPGA, an ASIC, a PLA, a PLD, or a CPLD. Further, the CPU 1230 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 12, the data processing system 1200 can include that the SB/ICH 1220 is coupled through a system bus to an I/O Bus, a read only memory (ROM) 1256, universal serial bus (USB) port 1264, a flash binary input/output system (BIOS) 1268, and a graphics controller 1258. PCI/PCIe devices can also be coupled to SB/ICH 1288 through a PCI bus 1262.

The PCI devices may include, for example, Ethernet adapters, add-in cards, and PC cards for notebook computers. The Hard disk drive 1260 and CD-ROM 1266 can use, for example, an integrated drive electronics (IDE) or serial advanced technology attachment (SATA) interface. In one implementation the I/O bus can include a super I/O (SIO) device.

Further, the hard disk drive (HDD) 1260 and optical drive 1266 can also be coupled to the SB/ICH 1220 through a system bus. In one implementation, a keyboard 1270, a mouse 1272, a parallel port 1278, and a serial port 1276 can be connected to the system bus through the I/O bus. Other peripherals and devices that can be connected to the SB/ICH 1220 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 14:
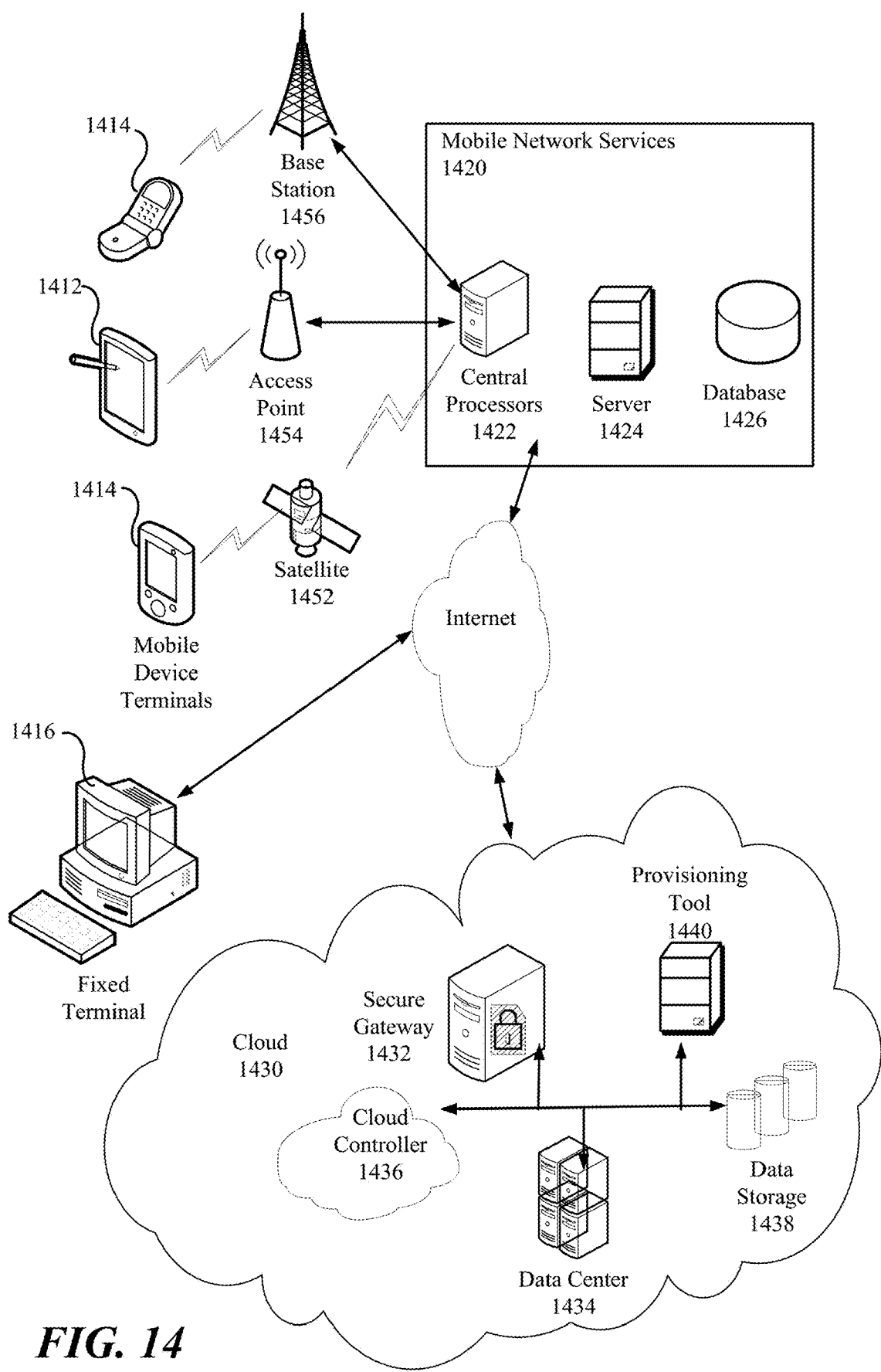
FIG. 14 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 14, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A method for compressive sensing based communications of low range (LoRa) devices in a low power wide area network (LPWAN) comprising at least one sensor selected from the group consisting of an accelerometer, an altimeter, and a temperature sensor; a GPS module and an antenna, said method comprising:

receiving, by a physical layer of a LoRa device, a bit stream of sensor measurements from the at least one sensor at an incoming velocity;

encoding the bit stream to generate an encoded bit stream;

modulating the encoded bit stream by chirp spread spectrum modulation to generate a chirp modulated encoded bit stream;

forming a first transmission packet including at least a preamble, the chirp modulated encoded bit stream and a cyclic redundancy check (CRC);

receiving the first transmission packet by a multiple access layer (MAC) of the LoRa device;

compressing the chirp modulated encoded bit stream of the first transmission packet into sparse vectors;

combining the sparse vectors with a linear combination of a randomly selected set of sparse vectors representing past measurements and the in-coming velocity of the bit stream to generate a payload;

forming a second transmission packet including the preamble, the payload and the cyclic redundancy check;

transmitting, the second transmission packet through the antenna at a randomly selected time.

2. The method of claim 1, further comprising:

encoding the bit stream by:

encoding the bits with a Hamming encoder, by using Hamming forward error correction to form a first coded bit sequence;

interleaving the first coded bit sequence to form a second coded bit sequence; and applying Gray indexing to the second coded bit sequence to prevent off-by-one errors when resolving symbols to generate a third coded bit sequence.

3. The method of claim 2, further comprising:

modulating the encoded bit stream by combining the third coded bit sequence with a base chirp signal generated by a local oscillator at a chirp rate.

4. The method of claim 3, further comprising:

selecting a channel bandwidth from the group consisting of 125 kHz, 250 kHz and 500 kHz;

matching a coding rate to a channel coding rate, wherein the coding rate is selected from $$R_c = \frac{4}{4+n} \text{ where}$$
$$n = \{1, 2, 3, 4\};$$

and encoding the signal bits by using Hamming forward error correction at the coding rate.

5. The method of claim 4, further comprising:

compressing the chirp modulated encoded bit stream of the first transmission packet into sparse vectors by retaining only non-zero values of the sparse vectors.

6. The method of claim 5, further comprising:

mapping the second transmission packet to in-phase and quadrature transmission paths; and transmitting the second transmission packet according to the mapping.

7. The method of claim 6, further comprising:

transmitting the second transmission packet according to a Class A protocol, in which the LoRa device sleeps until it wakes for transmission at the randomly selected time.

* * * * *

UNITED STATES PATENT AND TRADEMARK OFFICE
CERTIFICATE OF CORRECTION

PATENT NO. : 11,051,153 B1
APPLICATION NO. : 17/062186
DATED : June 29, 2021
INVENTOR(S) : Abdulah Aljohani et al.

It is certified that error appears in the above-identified patent and that said Letters Patent is hereby corrected as shown below:

On the Title Page

Item (72), Inventors:
"Abdulah Aljohani, Jeddah (SA);"
Should read:
-- Abdulah Jeza Aljohani, Jeddah (SA); --.

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*